(12) United States Patent
Lee et al.

(10) Patent No.: US 7,153,781 B2
(45) Date of Patent: Dec. 26, 2006

(54) METHOD TO ETCH POLY SI GATE STACKS WITH RAISED STI STRUCTURE

(75) Inventors: Heon Lee, Sunnyvale, CA (US); Young-Jin Park, Kyung-di-do (KR)

(73) Assignee: Infineon Technologies AG, Munich (DE)

( * ) Notice: Subject to any disclaimer, the term of this patent is extended or adjusted under 35 U.S.C. 154(b) by 247 days.

(21) Appl. No.: 10/638,673

(22) Filed: Aug. 11, 2003

(65) Prior Publication Data

US 2004/0048483 A1 Mar. 11, 2004

Related U.S. Application Data

(63) Continuation of application No. 09/596,484, filed on Jun. 19, 2000.

(51) Int. Cl.
*H01L 21/302* (2006.01)
(52) U.S. Cl. .................. 438/719; 438/248; 438/257; 438/259; 438/391; 257/E21.206; 257/E21.628
(58) Field of Classification Search ........... 438/719, 438/700, 702, 723, 721
See application file for complete search history.

(56) References Cited

U.S. PATENT DOCUMENTS

| | | | |
|---|---|---|---|
| 4,517,731 A * | 5/1985 | Khan et al. ............ 438/210 |
| 4,688,063 A | 8/1987 | Lu et al. |
| 4,801,988 A | 1/1989 | Kenney |
| 4,829,017 A | 5/1989 | Malhi |
| 4,918,502 A | 4/1990 | Kaga et al. |
| 4,937,643 A | 6/1990 | Deslauriers et al. |
| 5,100,817 A | 3/1992 | Cederbaum et al. |
| 5,173,439 A | 12/1992 | Dash et al. |
| 5,188,980 A * | 2/1993 | Lai ........................ 438/9 |
| 5,238,859 A | 8/1993 | Kamijo et al. |

(Continued)

FOREIGN PATENT DOCUMENTS

WO   WO-98/27586   6/1998

OTHER PUBLICATIONS

Rossnagel et al, Handbook of Plasma processing Technology—Fundamentals, Etching, Deposition, and Surface Interactions; William Andrew Publishing; 1990 p. 201, 203, 220.*

(Continued)

*Primary Examiner*—Nadine Norton
*Assistant Examiner*—Patricia A. George
(74) *Attorney, Agent, or Firm*—Slater & Matsil, L.L.P.

(57) ABSTRACT

In a process for etching poly Si gate stacks with raised STI structure where the thickness of poly Si gates at the AA and STI are different, the improvement comprising:
 a) etching a gate silicide layer+a poly Si 2 layer;
 b) forming a continuous poly Si passivation layer on sidewalls of the silicide and poly Si 2 layers and at the interface of the poly Si 2 layer and a poly Si 1 layer and affecting thermal oxidation to form an underlying thin Si oxide gate layer;
 c) affecting a Si oxide breakthrough etch to clear the passivation layer at interface of the poly Si 2 and the poly Si 1 layers while leaving intact the passivation layer on the sidewalls of the silicide and the poly Si 2 layers; and
 d) etching the poly Si 1 layer with an oxide selective process to preserve the underlying thin gate oxide and thin passivation layer at the sidewall to obtain vertical profiles of poly Si gate stacks both at the AA and the STI oxide.

20 Claims, 2 Drawing Sheets

U.S. PATENT DOCUMENTS

| | | | |
|---|---|---|---|
| 5,264,716 A | 11/1993 | Kenney | |
| 5,314,576 A * | 5/1994 | Kadomura | 216/67 |
| 5,380,675 A | 1/1995 | Hsue et al. | |
| 5,422,290 A * | 6/1995 | Grubisch | 438/234 |
| 5,438,006 A | 8/1995 | Chang et al. | |
| 5,441,904 A * | 8/1995 | Kim et al. | 438/592 |
| 5,453,156 A * | 9/1995 | Cher et al. | 438/695 |
| 5,455,444 A * | 10/1995 | Hsue | 257/413 |
| 5,486,714 A | 1/1996 | Hong | |
| 5,539,229 A | 7/1996 | Noble, Jr et al. | |
| 5,545,578 A | 8/1996 | Park et al. | |
| 5,554,545 A * | 9/1996 | Wu et al. | 438/396 |
| 5,629,221 A | 5/1997 | Chao et al. | |
| 5,656,533 A * | 8/1997 | Kim | 438/396 |
| 5,706,164 A | 1/1998 | Jeng | |
| 5,714,398 A | 2/1998 | Chao et al. | |
| 5,776,808 A | 7/1998 | Muller et al. | |
| 5,801,083 A | 9/1998 | Yu et al. | |
| 5,807,789 A | 9/1998 | Chen et al. | |
| 5,838,044 A * | 11/1998 | Chang et al. | 257/369 |
| 5,902,125 A | 5/1999 | Wu | |
| 5,915,183 A | 6/1999 | Gambino et al. | |
| 5,951,897 A | 9/1999 | Wauer et al. | |
| 6,022,781 A | 2/2000 | Noble, Jr. et al. | |
| 6,033,943 A * | 3/2000 | Gardner | 438/199 |
| 6,091,119 A * | 7/2000 | Wu | 257/390 |
| 6,107,158 A | 8/2000 | Zheng et al. | |
| 6,121,073 A * | 9/2000 | Huang et al. | 438/132 |
| 6,123,862 A * | 9/2000 | Donohoe et al. | 216/17 |
| 6,143,644 A | 11/2000 | Chen et al. | |
| 6,150,234 A | 11/2000 | Olsen | |
| 6,150,235 A | 11/2000 | Doong et al. | |
| 6,190,971 B1 * | 2/2001 | Gruening et al. | 438/270 |
| RE37,104 E | 3/2001 | Doan et al. | |
| 6,225,187 B1 | 5/2001 | Huang et al. | |
| 6,228,712 B1 | 5/2001 | Kawai et al. | |
| 6,235,589 B1 | 5/2001 | Meguro | |
| 6,268,251 B1 * | 7/2001 | Zhong et al. | 438/275 |
| 6,323,089 B1 | 11/2001 | Kao et al. | |
| 6,348,383 B1 | 2/2002 | Tseng | |
| 6,492,250 B1 | 12/2002 | Horiuch et al. | |

OTHER PUBLICATIONS

Wolf et al, Silicon Processing for the VLSI Era; vol. 1 Process Technology, Lattice Press, 1986; p. 545.*

Chatterjee, P., et al., "Trench and Compact Structures for DRAMs," IEDM 86, Technical Digest paper 6.1; pp. 128-131, IEEE 1986.

"CMOS Semiconductor Memory Structural Modification to Allow Increased Memory Charge," IBM Technical Disclosure Bulletin, vol. 31, No. 11, pp. 162-5, Apr. 1989.

* cited by examiner

METHOD TO ETCH POLY SI GATE STACKS WITH RAISED STI STRUCTURE

This application is a continuation of patent application Ser. No. 09/596,484 entitled METHOD TO ETCH POLY SI GATE STACKS WITH RAISED STI STRUCTURE, filed on Jun. 19, 2000, which application is incorporated herein by reference.

BACKGROUND OF THE INVENTION

1. Field of Invention

The present invention relates to a method for etching poly Si gate stacks with raised shallow trench isolation (STI) on a substrate where the thickness of the poly Si gates at the AA and STI oxide is different.

2. Description of the Related Art

In contemporary Complementary Metal Oxide Semiconductor (CMOS) technology, field effect transistors are employed that are adjacent to or bounded by trenches to affect semiconductor isolation techniques. More particularly, the isolation is referred to as shallow trench isolation (STI), which is an isolation technique in which the insulating material or trench extends beyond or is raised above the surface of the substrate on top of the gate stack. Even more particularly, it relates to an isolation structure for a transistor in a DRAM (dynamic random access memory) cell.

Designers of technologies for producing semiconductor devices have been continually inspired to increase device densities to remain cost and performance competitive. As a result, VLSI and ULSI technologies entered the sub-micron realm of structural dimensions and are designing technologies in the nanometer feature size range. In the future atomic physical limits will be reached in the conventional two-dimensional design approach to semiconductor device design.

Dynamic Random Access Memory (DRAM) designers have met the challenges in advancing technologies by pushing the limits of feature size resolution with each generation of DRAM. Thus, designers of 64 K bit DRAMs ere perplexed to learn that a practical physical limit to charge capacity of storage capacitors had already been reached due to the minimum charge capacity required to allow reliable data signal sensing in the presence of naturally occurring atomic particle radiation inherently present in fabrication materials and the operating environment.

Storage capacitors in the range of about 50 femtofarads are now considered to be a physical limit. This limitation prevented a continuation of the scaling of DRAM dimensions and voltages initiated in the early 1970s. Reduction in the surface area of semiconductor substrate utilized by the DRAM storage capacitor has been severely restricted. Due to decreases in the thickness of reliable capacitor dielectric materials, existing 1 Megabit (1 Mb) DRAM technologies continue to enjoy the freedom of planar, two-dimensional device and circuit design.

Beginning with 4 Mb DRAMs, three-dimensional design has been utilized to the extent that the single device/capacitor memory cell has been altered to provide the capacitor in a vertical dimension.

In such designs, the capacitor is formed in a trench formed in the surface of the semiconductor substrate. In still denser designs, other forms of three-dimensional capacitors are proposed, such as stacking the plates of the capacitors above the transfer device. Such designs, however, present difficulties in forming the interconnections to the required wordaccess and data bit lines to the DRAM memory cell. Additional designs have been proposed in which the transfer device and its associated capacitor are both formed within a trench of preferably minimum feature size.

A large number of proposals for 16 Mb and greater density DRAM cell designs have avoided continuing development of trench cell technology because of the existence of charge leakage mechanisms known to be present in trench capacitor structures. As these leakage mechanisms have become known, extensions of trench DRAM cells designs have been used successfully in 16 Mb designs.

"Trench and Compact Structures for DRAMs" by P. Chatterjee et al., International Electron Devices Meeting 1986, Technical Digest paper 6.1, pp. 128–131, disclose variations in trench cell designs through 16 Mb DRAM designs, including the Substrate Plate Trench (SPT) cell disclosed in U.S. Pat. No. 4,688,063. The SPT cell uses a highly conductive substrate as the DRAM cell plate. The storage node of each cell is formed in a deep trench in the substrate.

U.S. Pat. No. 4,801,988 disclose an improved SPT cell which includes a thick isolation region formed within the trench to enable higher density packaging of DRAM cells. The article "CMOS Semiconductor Memory Structural Modification to Allow increased Memory Charge" anonymous, IBM Technical Disclosure Bulletin, Vol. 31, No. 11, April 1989, pp. 162–5, disclose a method of isolating the substrate plate of an SPT cell from support devices by providing a buried region under support devices in order to allow the plate reference voltage to be separately biased at an optimum Vdd/2 volts.

U.S. Pat. No. 4,829,017 disclose a method of forming a buried doped layer in a substrate by forming a shallow trench, protecting its sidewalls, further extending the trench and doping the walls of the extended trench to form a continuous doped region useful as the storage node of a trench DRAM.

U.S. Pat. No. 4,918,502 relates to variations in SPT DRAM cells in which a buried region of opposite conductivity type from the substrate is used on one plate of the DRAM storage capacitor. A buried plate trench DRAM cell in which the storage node of the cell and a sheath plate are formed in a single trench is disclosed. At the bottom of the trench a diffusion of opposite type from the substrate is formed such that the diffusions of adjacent cells interconnect forming a grid-like structure. One or more trenches not associated with a DRAM cell is formed to act as a reach through to enable the doped regions to be biased at a suitable reference voltage.

A severe disadvantage for raised STI structures is that the thickness of the poly Si gates at the AA and the STI oxide is different. This difference in thickness of poly Si gates at the AA and the STI oxide makes it very difficult during the manufacturing process to obtain vertical profiles of the poly Si gate stacks both at the AA and at the STI oxide.

While etching the poly Si gate with raised STI structure, poly Si notching is typically observed at the STI oxide and poly Si tapering is typically observed at the AA.

Therefore, there is a need in the art of semiconductor isolation techniques, more particularly, in shallow trench isolation (STI) in which insulating material is raised above the surface of the semiconductor—for a method to eliminate the different thickness and thereby eliminate or substantially reduce poly Si notching at the STI oxide and poly Si tapering at the AA or both.

SUMMARY OF THE INVENTION

One object of the present invention is to provide a method of providing etching of a poly Si gate stack with raised STI structures to obtain vertical profiles of poly Si gate stacks both at the AA and at the STI oxide.

Another object of the present invention is to provide a method for etching poly Si gate stacks with raised STI structure in a manner such that poly Si notching at the STI oxide and poly Si tapering at the AA or both is eliminated while etching the poly Si gate with raised STI structure.

A further object of the present invention is to provide a method of etching poly Si gate stacks with raised STI structure to obtain vertical profiles of poly Si gate stacks both at the AA and at the STI oxide by eliminating poly Si notching at the STI oxide and eliminating poly Si tapering at the AA, by use of a combination of applying a poly Si passivation layer and selectively clearing away the passivation layer.

A further object yet still of the present invention is to provide a method of etching poly Si gate stacks with raised STI structure to obtain vertical profiles of poly Si gate stacks both at the AA and at the STI oxide, by eliminating poly Si notching at the STI oxide and eliminating poly Si tapering at the AA by the combination of applying a poly Si passivation layer and selectively clearing away the passivation layer in a single reactive ion etching (RIE) chamber.

In general the invention is accomplished by: etching a gate silicide layer+a poly Si 2 layer; forming a continuous poly Si passivation layer on sidewalls of said silicide and poly Si 2 layers and at the interface of said poly Si 2 layer and a poly Si 1 layer; affecting a Si oxide break-through etch to clear the passivation layer at the interface of said poly Si 2 and said poly Si 1 layers while leaving intact said passivation layer on said sidewalls of said silicide and said poly Si 2 layers; and etching said poly Si 1 layer with an oxide selective process to preserve the underlying thin gate oxide and thin passivation layer at the sidewall to obtain vertical profiles of poly Si gate stacks both at the AA and the STI oxide.

DESCRIPTION OF THE PREFERRED EMBODIMENTS

Figure 1:
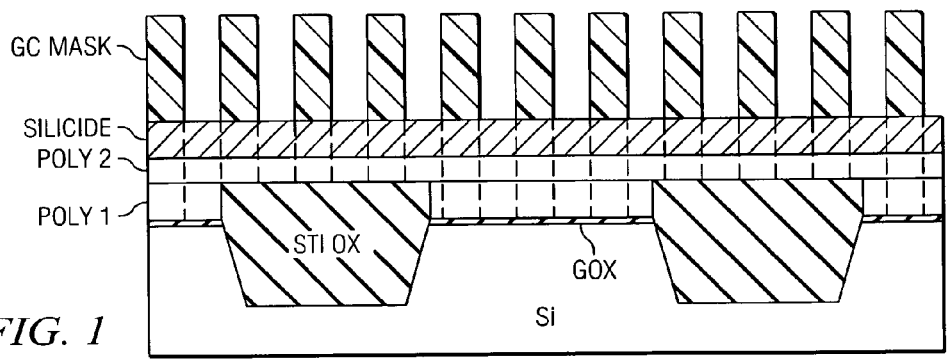
FIG. 1 is a graphic depiction of a poly Si gate stack with raised STI structure before etching of the gate stack.

In raised STI structures, the thickness of the poly Si gates at the AA and STI oxide is different, thereby making it very difficult to obtain vertical profiles of poly Si gate stacks both at the AA and at the STI oxide. In this connection, for background elucidation, reference is now made to FIG. 1 in which there is exemplarily shown a poly Si gate stack with raised STI structure prior to the gate stack etch.

Figure 2A:
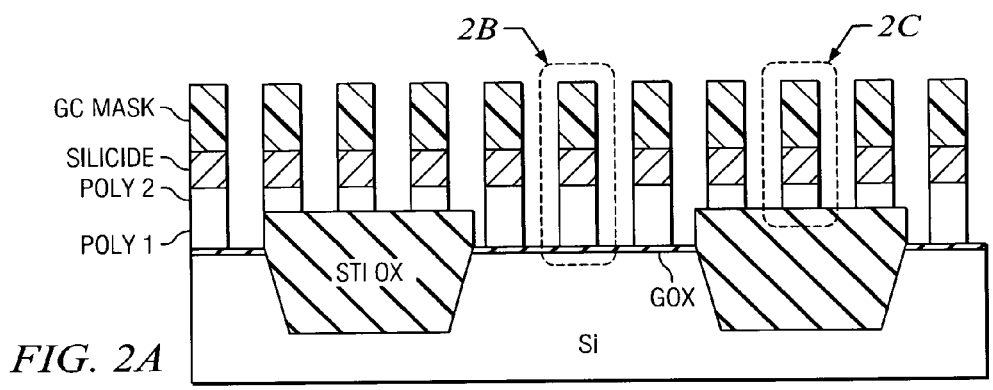
FIGS. 2A, 2B and 2C, collectively known as FIG. 2, are graphic depictions of a poly Si gate stack with enlarged sections showing poly Si tapering at the gates on AA and poly Si notching at the gates on the STI oxide.
Figures 2B, 2C:
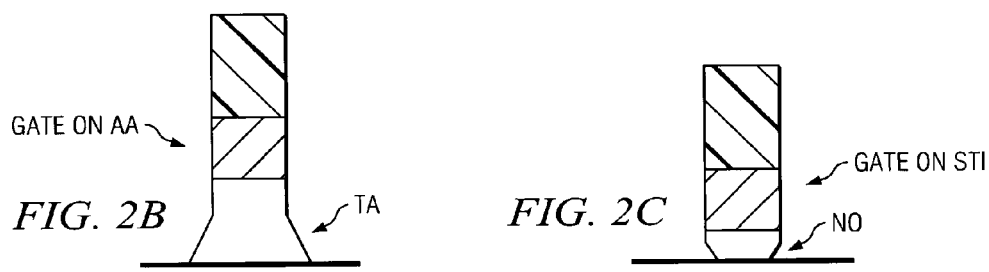

However, upon or after gate stack etching, as can be seen from FIG. 2, obtaining vertical profiles of the poly Si gate stacks both at the AA and at the STI oxide is very difficult due to the fact that poly Si notching NO occurs at the gate on the STI and poly Si tapering TA occurs at the gate on the AA during etching of the poly Si gate with the raised STI structure.

Figure 3:
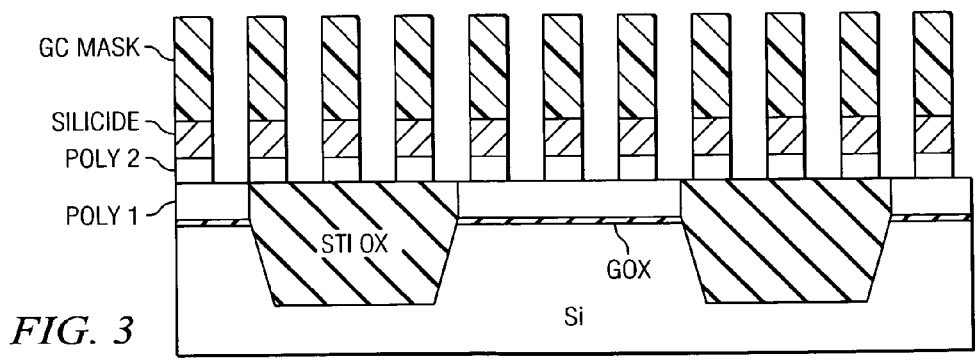
FIG. 3 is a graphic depiction of a poly Si gate stack with raised STI structure showing a silicide etch and poly Si etch, in which the etch stops at the interface between poly 1 and poly 2.

The invention etching method etches the gate structure both at the AA and at the STI oxide by utilizing a combination of poly Si passivation and selectively clearing the passivation layer. To clarify this innovation, reference is made to FIG. 3 which graphically depicts the silicide/poly 1 etch, in which a normal gate silicide etch and poly Si etch is affected, and the etch stops at the interface between poly 1 and poly 2.

Figure 4:
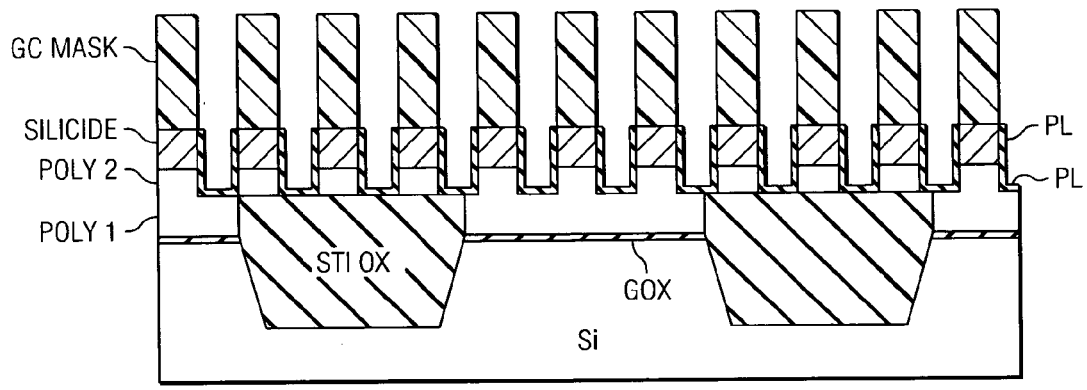
FIG. 4 is a graphic depiction of a poly Si gate stack with raised STI structure showing poly Si oxidation or Si chemical oxide deposition to create a poly Si passivation layer.

Thereafter, a continuous poly Si passivation layer is formed on sidewalls of the silicide and poly Si 2 layers and at the interface of said poly Si 2 layer and the poly Si 1 layer. In this connection, a poly Si oxidation or a plasma assisted chemically grown oxide may be deposited and used as the passivation layer. The chemically grown oxide may be selected from the group consisting of $SiO_2$:Cl, $SiO_2$:Br, and $SiO_2$:F to permit deposition to be formed to create a poly Si passivation layer PL on the silicide and poly 2 layers as shown in FIG. 4.

Figure 5:
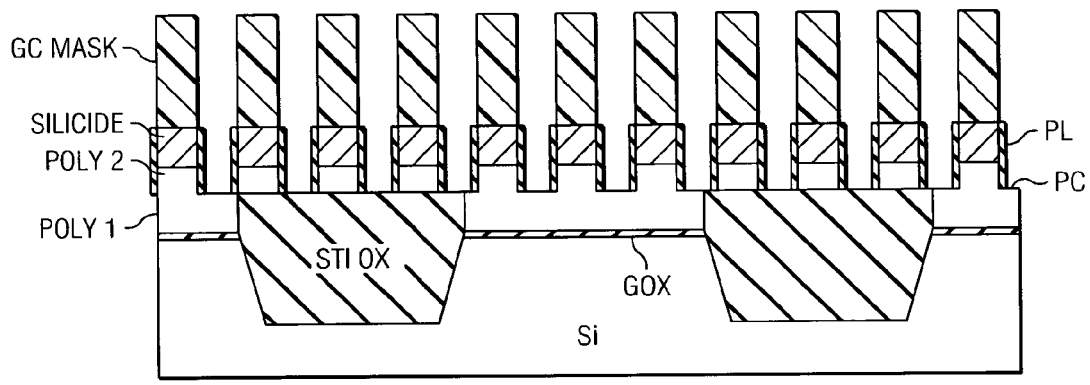
FIG. 5 is a graphic depiction showing a poly Si gate stack with raised STI structure and showing the Si oxide break-through etch that clears the passivation layer at the bottom only.

A Si oxide break-through etch is next performed to achieve a passivation cleared PC or clear passivation layer at the bottom of the poly 2 layer, as is shown in FIG. 5.

Figure 6:
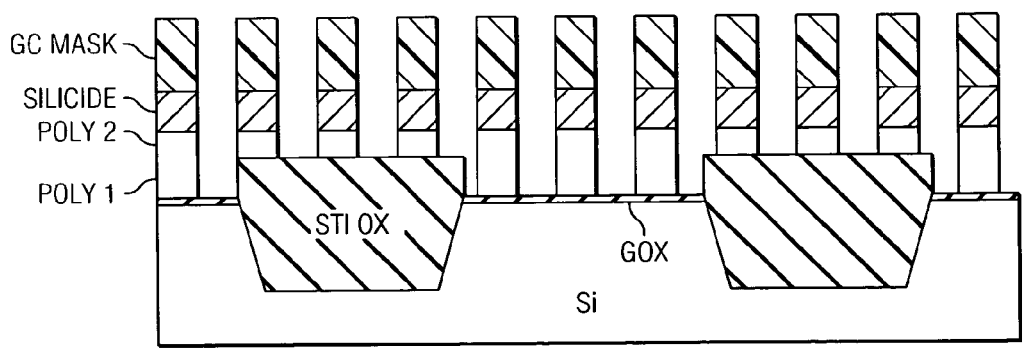
FIG. 6 is a graphic depiction of a poly Si gate stack with raised STI structure showing Si oxide selective poly Si 2 to main etch and over etch.

A Si oxide selective etch of poly Si 2 is next utilized to accomplish a main etch and an over etch, as is shown in FIG. 6, to obtain a gate structure with vertical profiles both at the AA and at the STI oxide as a result of the combination of poly Si passivation and selective clearing of the passivation layer.

In summarization, the invention process is accomplished by first using a normal gate stack etch process (etch of gate silicide+poly Si 2), after which a poly Si passivation step is utilized to create a continuous passivation layer. In this connection, a thermal oxidation process can be used to form an extremely thin Si oxide layer. The passivation may also be accomplished in a conventional RIE chamber. Plasma assisted chemically grown oxide ($SiO_2$:Cl, $SiO_2$:Br and $SiO_2$:F) is deposited and used as the passivation layer. Next, an oxide breakthrough step, which selectively clears the passivation layer only at the bottom, and not on sidewall, is performed. Finally, the poly Si 1 layer is then etched with a highly oxide selective process to preserve not only the underlying thin gate oxide but also the thin passivation layer at the sidewall.

The advantages of the method of etching poly Si gate stacks with raised STI structures are as follows:

1) the big difference in thickness of poly Si gates at the AA and at the STI oxide is eliminated thereby permitting the accomplishment of vertical profiles of poly Si gate stacks both at the AA and at the STI oxide;

2) all steps including poly Si passivation can be accomplished in a conventional single RIE chamber; and 3) poly Si notching at the gates on STI oxide and poly Si tapering at the gates on AA can be eliminated and vertical profiles for both poly Si gates on the AA and poly Si gates on the STI oxide can be achieved.

We claim:

1. A process for etching poly silicon gate stacks with a raised shallow trench isolation (STI) structure where the thickness of poly silicon gate stacks at the active area (AA) and STI are different, and wherein said poly silicon gate stacks comprise a gate silicide layer, a second poly silicon layer and a first poly silicon layer that overlie a gate oxide, the process comprising:
   a) etching said gate silicide layer and said second poly silicon layer thereby exposing a top surface of said first poly silicon layer;
   b) forming a continuous passivation layer on sidewalls of said silicide layer and second poly silicon layer and on the exposed top surface of said first poly silicon layer;
   c) affecting a breakthrough etch to clear the passivation layer on the exposed top surface of said first poly silicon layer while leaving intact said passivation layer on said sidewalls of said silicide layer and second poly silicon layer; and
   d) etching said first poly silicon layer with an oxide selective process to preserve the underlying thin gate oxide and to preserve the passivation layer at the sidewalls of said silicide layer and second poly silicon layer to obtain vertical profiles of poly silicon gate stacks both at the AA and the STI oxide.

2. The process of claim 1 wherein a plasma assisted chemically grown oxide is deposited and used as said passivation layer.

3. The process of claim 2 wherein said chemically grown oxide is selected from the group consisting of $SiO_2$:Cl, $SiO_2$:Br, and $SiO_2$:F.

4. The process of claim 3 wherein said chemically grown oxide is $SiO_2$:Cl.

5. The process of claim 3 wherein said chemically grown oxide is $SiO_2$:Br.

6. The process of claim 3 wherein said chemically grown oxide is $SiO_2$:F.

7. The process of claim 2 further comprising:
   over etching said first poly silicon layer with an oxide selective process to remove the passivation layer at the sidewalls of said silicide layer and said second poly silicon layer.

8. The process of claim 2 wherein affecting a breakthrough etch comprises affecting a silicon oxide breakthrough etch.

9. The process of claim 1 wherein said continuous passivation layer is formed in a RIE chamber.

10. A process for etching gate stacks raised shallow trench isolation structures between active area regions, the process comprising:
    (a) providing an active area having a stack of layers thereon, the stack comprising a gate oxide layer, a first polysilicon layer, a second polysilicon layer, a gate silicide layer and a gate conductor mask layer, wherein the active area is adjacent shallow trench isolations that extend to an interface surface between the first polysilicon layer and the second polysilicon layer;
    (b) patterning the gate silicide layer and the second polysilicon layer;
    (c) forming a continuous polysilicon passivation layer on sidewalls of the patterned gate silicide layer and of the second polysilicon layer and at the interface surface of the first polysilicon layer and the second polysilicon layer;
    (d) performing a breakthrough etch to remove the passivation layer from the interface surface between the first polysilicon layer and the second polysilicon layer while leaving intact the passivation layer on the sidewalls of the gate silicide layer and of the second polysilicon layer; and
    (e) etching the first polysilicon layer with an oxide selective process thereby preserving the underlying gate oxide layer and the passivation layer on the sidewalls, the passivation layer preventing notching of the gate stacks on the shallow trench isolation structures thereby obtaining vertical profiles of the gate stacks both on the active area and on the shallow trench isolation structures.

11. The process of claim 10, wherein forming a continuous polysilicon passivation layer comprises forming a plasma assisted chemically grown oxide as the passivation layer.

12. The process of claim 11, wherein the chemically grown oxide is selected from the group consisting of $SiO_2$:Cl, $SiO_2$:Br, $SiO_2$:F.

13. The process of claim 10, wherein the continuous passivation layer is formed in a reactive ion etching chamber.

14. A method of making a semiconductor device, the method comprising:
    providing an active area surrounded by a raised shallow trench isolation structure;
    forming a gate stack in the active area, the gate stack comprising a first polysilicon layer overlying the active area, a second polysilicon layer overlying the first polysilicon layer and a silicide layer overlying the second polysilicon layer;
    etching the silicide layer and the second polysilicon layer thereby exposing sidewalls of the silicide layer and the second polysilicon layer;
    forming a passivation layer over the sidewalls of the silicide layer and the second polysilicon layer and over an exposed portion of the first polysilicon layer;
    performing a breakthrough etch to remove the passivation layer from the exposed portion of the first polysilicon layer, the breakthrough etch leaving the passivation layer along the sidewalls of the silicide layer and the second polysilicon layer; and
    etching the exposed portion of the first polysilicon layer wherein the passivation layer prevents etching of the sidewalls of the silicide layer and the second polysilicon layer.

15. The method of claim 14, wherein forming a passivation layer comprises forming an oxide passivation layer.

16. The method of claim 15, wherein the gate stack further includes a gate oxide beneath the first polysilicon layer, wherein the gate oxide is not etched during the step of etching the exposed portion of the first polysilicon layer.

17. The method of claim 15, wherein forming a passivation layer comprises thermally growing an oxide layer.

18. The method of claim 15, wherein forming a passivation layer comprises depositing an oxide using a plasma assisted process.

19. The method of claim 14, further comprising removing the passivation layer after etching the first polysilicon layer.

20. The method of claim 14, wherein providing the gate stack in the active area comprises providing a gate stack in which a top surface of the first polysilicon layer is substantially co-planar with a top surface of the raised shallow trench isolation structure.

* * * * *